United States Patent
Lewis et al.

(10) Patent No.: US 7,502,725 B2
(45) Date of Patent: Mar. 10, 2009

(54) METHOD, SYSTEM AND COMPUTER PROGRAM PRODUCT FOR REGISTER MANAGEMENT IN A SIMULATION ENVIRONMENT

(75) Inventors: William J. Lewis, Poughkeepsie, NY (US); Wei-Yi Xiao, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 445 days.

(21) Appl. No.: 10/835,324

(22) Filed: Apr. 29, 2004

(65) Prior Publication Data

US 2005/0251379 A1   Nov. 10, 2005

(51) Int. Cl.
G06F 9/45 (2006.01)
(52) U.S. Cl. .......................... 703/22; 711/214; 712/211
(58) Field of Classification Search .................... 703/22
See application file for complete search history.

(56) References Cited

U.S. PATENT DOCUMENTS

| | | | |
|---|---|---|---|
| 4,831,515 A | 5/1989 | Kamada et al. | 712/217 |
| 4,901,260 A | 2/1990 | Lubachevsky | 703/17 |
| 4,991,080 A * | 2/1991 | Emma et al. | 712/206 |
| 5,202,889 A * | 4/1993 | Aharon et al. | 714/739 |
| 5,377,336 A * | 12/1994 | Eickemeyer et al. | 712/207 |
| 5,459,849 A | 10/1995 | Nguyen et al. | 712/248 |
| 5,546,554 A | 8/1996 | Yung et al. | 711/203 |
| 5,729,554 A | 3/1998 | Weir et al. | |
| 5,845,106 A | 12/1998 | Stapleton | 703/21 |
| 5,867,725 A | 2/1999 | Fung et al. | 712/23 |
| 6,006,028 A | 12/1999 | Aharon et al. | 703/21 |
| 6,077,304 A | 6/2000 | Kasuya | 703/14 |
| 6,131,157 A | 10/2000 | Wang et al. | 712/218 |
| 6,389,382 B1 | 5/2002 | Tanaka et al. | 703/21 |
| 6,477,683 B1 * | 11/2002 | Killian et al. | 716/1 |
| 6,671,794 B1 | 12/2003 | Giamei et al. | |
| 6,732,297 B2 * | 5/2004 | Oura | 714/33 |

(Continued)

FOREIGN PATENT DOCUMENTS

EP   3019132 A2   6/1989

(Continued)

OTHER PUBLICATIONS

Shintani et al, "Hierarchical Execution to Speed Up Pipeline Interlock in Mainframe Computers", IEEE Transactions on Computers, vol. 45, No. 5, May 1996.*

(Continued)

*Primary Examiner*—Paul L Rodriguez
*Assistant Examiner*—Mary C Jacob
(74) *Attorney, Agent, or Firm*—Cantor Colburn LLP; Lynn Augspurger

(57) ABSTRACT

A method for register management in a simulation environment including receiving an instruction from an instruction unit decode pipeline. An address generation interlock (AGI) function is executed in the simulation environment if the instruction is an AGI instruction. The executing an AGI function is responsive to a pool of registers controlled by a register manager and to the instruction. An early AGI function is executed in the simulation environment if the instruction is an early AGI instruction. The executing an early AGI function is responsive to the pool of registers and to the instruction.

13 Claims, 6 Drawing Sheets

U.S. PATENT DOCUMENTS 6,760,888 B2 * 7/2004 Killian et al. ................... 716/1
6,978,216 B2 * 12/2005 Sweet ........................ 702/118
7,096,347 B2 * 8/2006 Moore ........................ 712/227

FOREIGN PATENT DOCUMENTS

| JP | 63298633 A | 12/1988 |
|---|---|---|
| WO | WO8502279 A1 | 1/1989 |
| WO | WO8502280 A1 | 12/1990 |

OTHER PUBLICATIONS

IBM Technical Disclosure Bulletin, Nov. 1980, vol. 23, No. 6, pp. 2600-2604 Instruction Scan for an Early Resolution of a Branch Instruction.

IBM Technical Disclosure Bulletin, Sep. 1982, vol. 25, No. 4, pp. 2139-2140 Avoidance of Address Generation Interlock Delays on Branch Instructions.

IBM Technical Disclosure Bulletin, Jan. 1992, vol. 34, No. 8, pp. 330-335 Using History to Improve the Handling of Address Generation Interlocks in Branch instructions.

IBM Technical Disclosure Bulletin, Jan. 1993, vol. 36, No. 1, pp. 335-337 Handling Address Generation Interlocks Distribution Without Message Delay.

"Archimedes: An approach to architecture-independent modeling for high-level simulation", Proceedings of the International Conference on Computer Design: VLSI in computers and processors, Cambridge, MA Oct. 11-14, 1992, Los Alamitos, IEEE Comp. Soc. Press, US, XP010030868.

* cited by examiner

METHOD, SYSTEM AND COMPUTER PROGRAM PRODUCT FOR REGISTER MANAGEMENT IN A SIMULATION ENVIRONMENT

BACKGROUND OF THE INVENTION

The invention relates to simulation environments and in particular to simulating an instruction unit in a random simulation environment to verify address generation interlock (AGI) and AGI early resolution functions.

AGI can occur when an instruction attempts to compute an address by which to reference storage. This address computation (also referred to as "address add") is typically the addition of some of the following: the contents of one or more registers, a constant value from the instruction, and the address of the branch instruction itself. If a register is used for address generation and that register is modified by a previous instruction (a dependency), then address computation cannot proceed until that register is available. The delay caused by waiting for the register value is known as AGI. AGI occurs in the instruction unit when an instruction which has previously been decoded, but has not yet executed, alters a register which an instruction currently being decoded requires for reference to its upcoming address generation. In certain instructions, the target register future contents are available to the instruction unit prior to execution. To reduce AGI latency, which may lead to improved performance, the instruction unit uses the known register future contents, when available, instead of waiting for the execution unit to update the register of interest. This is referred to as AGI early resolution.

One of the difficulties in verifying the instruction unit for advanced processor design for computers in a random simulation environment has to do with providing random updates to registers in the processor. Currently, it is not possible to provide random updates to the registers for the normal resolution of the AGI functions for the decoding instructions and also to provide early calculated register contents which are stored in the instruction unit for special instructions (known as AGI early resolution).

SUMMARY OF THE INVENTION

One aspect of the invention is a method for register management in a simulation environment. The method includes receiving an instruction from an instruction unit decode pipeline. An address generation interlock (AGI) function is executed in the simulation environment if the instruction is an AGI instruction. Executing an AGI function is responsive to a pool of registers controlled by a register manager and to the instruction. An early AGI function is executed in the simulation environment if the instruction is an early AGI instruction. Executing an early AGI function is responsive to the pool of registers and to the instruction.

Another aspect of the invention is a computer program product for register management in a simulation environment. The computer program product includes a storage medium readable by a processing circuit and storing instructions for execution by the processing circuit for performing a method that includes receiving an instruction from an instruction unit decode pipeline. An address generation interlock (AGI) function is executed in the simulation environment if the instruction is an AGI instruction. Executing an AGI function is responsive to a pool of registers controlled by a register manager and to the instruction. An early AGI function is executed in the simulation environment if the instruction is an early AGI instruction. Executing an early AGI function is responsive to the pool of registers and to the instruction.

A further aspect of the invention is a system for register management in a simulation environment. The system includes a register manager including a pool of registers. The system also includes an execution unit driver in communication with the register manager and in communication with an instruction unit decode pipeline. The execution unit driver includes instructions to implement a method that includes receiving an instruction from an instruction unit decode pipeline. An address generation interlock (AGI) function is executed in the simulation environment if the instruction is an AGI instruction. Executing an AGI function is responsive to a pool of registers controlled by a register manager and to the instruction. An early AGI function is executed in the simulation environment if the instruction is an early AGI instruction. Executing an early AGI function is responsive to the pool of registers and to the instruction.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

Referring now to the drawings wherein like elements are numbered alike in the several FIGURES.

DETAILED DESCRIPTION OF THE PREFERRED EMBODIMENTS

Exemplary embodiments of the present invention provide a random simulation method for simulating the instruction unit of a mainframe. The simulation method includes a sequential and random register management technique to stimulate the address generation interlock (AGI) and early resolution AGI functions in instruction pipelines of a mainframe processor instruction units. This sequential and random register management technique has been uniquely designed to handle the pool of registers that the decoding instructions use for reading and writing. It is operated together with an execution unit driver and an address generation function to provide address generation for the decoding instructions in the instruction unit decode pipeline. Exemplary embodiments of the present invention include an execution unit driver which simulates the completion of the instructions in the processors. A register manager provides random and sequential values for the simulations of the instructions. The AGI and early AGI functions are exercised through the protocols of these components. By enabling the protocols of these components, an in order execution of the instruction pipeline and the high performance design of the processor can be simulated and verified. In this manner random updates to the AGI and early AGI functions can be simulated and verified during the test process.

Figure 1:
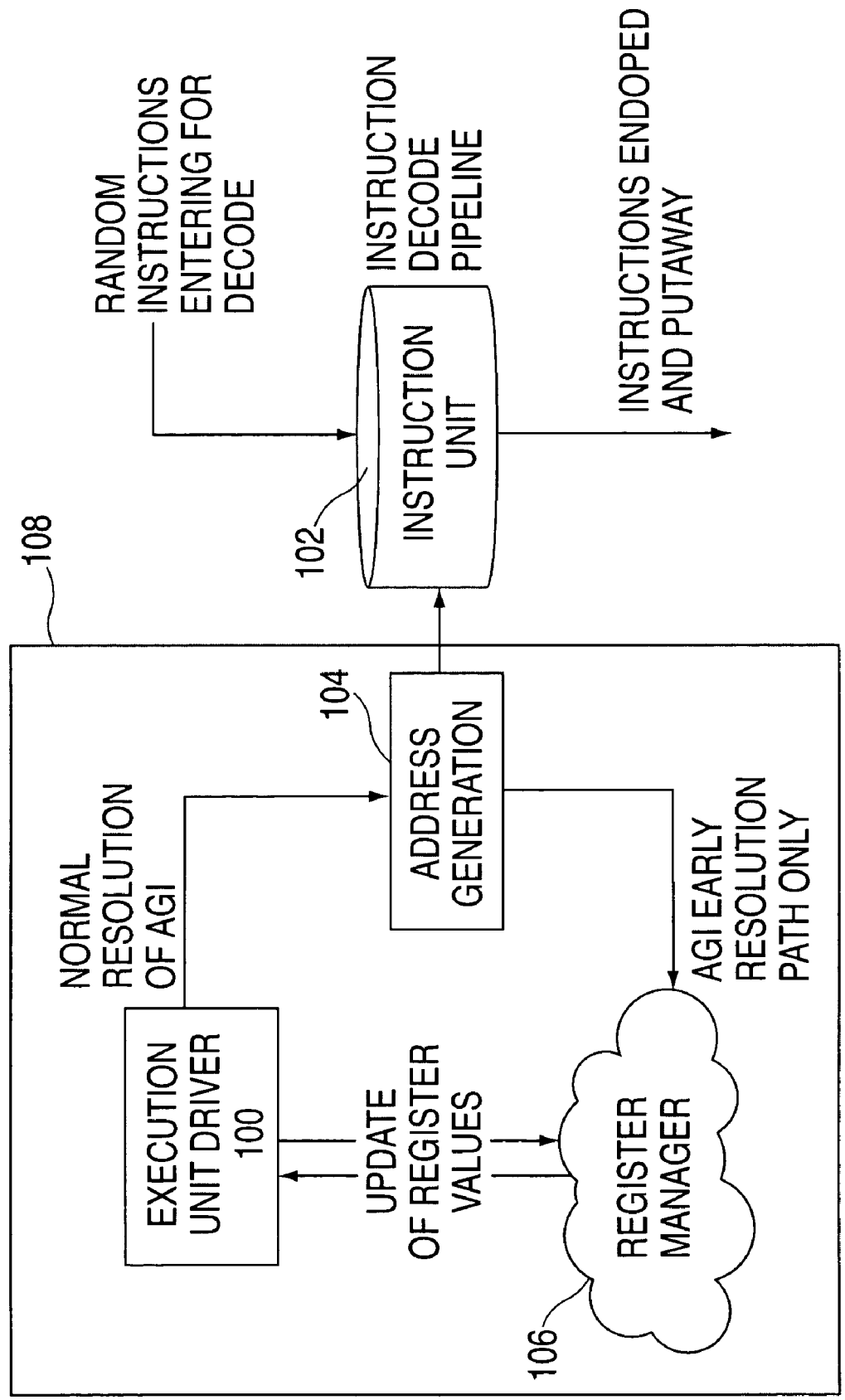
FIG. 1 is a block diagram of an instruction unit simulation environment that may be utilized by exemplary embodiments of the present invention.

FIG. 1 is a block diagram of an instruction unit simulation environment that may be utilized by exemplary embodiments of the present invention. It includes an execution unit driver 100, an instruction unit decode pipeline 102, address generation 104, and a register manager 106. As shown in FIG. 1, the AGI simulation components 108 include the execution unit driver 100, address generation 104 and register manager 106. The functions performed by the modules of the AGI simulation components 108 are executed within the instruction unit 102 during a simulation. Random instructions are entered into the instruction unit 102 for decoding. The instructions are executed in the instruction unit 102 (including executing the AGI simulation components 108) and when they are completed, the instructions are ended (e.g., endoped) and saved. The registers that are read by instructions during decode time are included in the read pool of the register manager 106. In most cases (e.g., for standard AGI resolution), random data is associated with a register write. For the set of instructions that can take advantage of AGI early resolution, the "correct" data is associated with the register write.

When an instruction is in an "E-1" state of the instruction pipeline (a state indicating that the instruction has completed an address add state), the write register associated with the instruction is put into the active pool. Being put into the active pool allows the register to be updated when the execution unit driver 100 requests registers for update. The current decoding instructions 102 will then use the updated values to do address generation 104 (e.g., an address add such as adding a displacement value to the contents of the register). For the AGI early resolution case, the address generation 104 is performed as soon as the register contents are resolved regardless of whether or not the instructions which write to the register have completed execution. When AGI early resolution instructions complete, the same register values which were stored earlier in the register manager 106 are updated from the execution unit driver 100.

Figure 2:
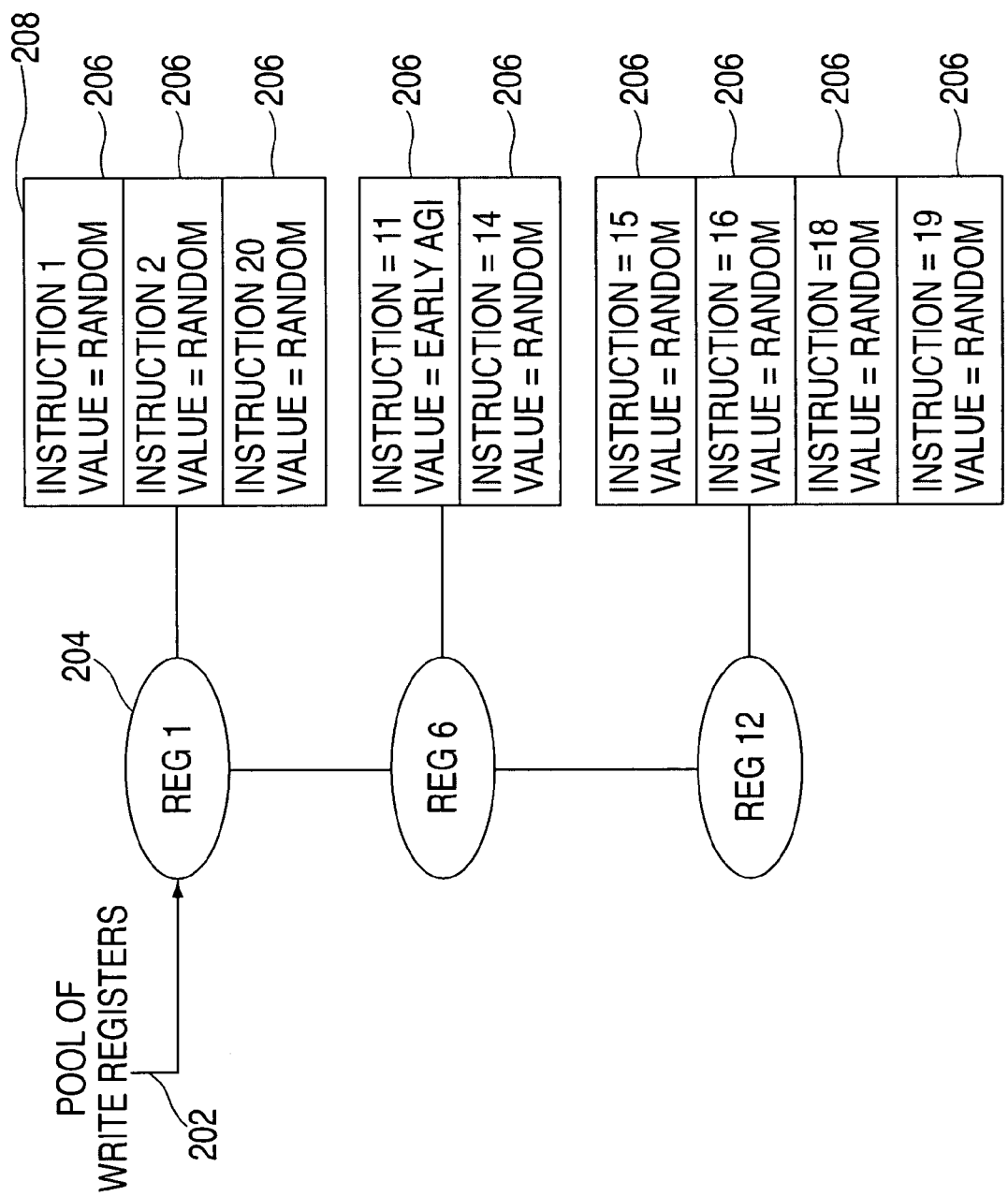
FIG. 2 is a block diagram of a register management unit for architecture mode instruction pipeline simulations in accordance with exemplary embodiments of the present invention.

FIG. 2 is a block diagram of a register management unit for architecture mode instruction pipeline simulations in accordance with exemplary embodiments of the present invention. Architecture mode is a mode in the simulation pipeline that the registers have to correlate with the instructions. Non-architecture mode is a mode in the simulation pipeline where the register updates may be random. It includes a pool of active write registers 202 in the form of a list. When multiple instructions 206 are writing to the same register 204, the instructions 206 are attached to the register 204 as a sub-list 208 with an instruction sequence number and random register values associated with the instruction. When the execution unit driver 100 requests one or two (or more) registers 202 for updating during a simulation cycle, the registration manager 106 will randomly select the registers 202 from the pool of active write registers 202. The registers 204 are not necessarily selected in architectural order even when the simulation pipeline is executing in architectural mode. In addition, the corresponding instruction or register will be removed from the pool of active write registers 202 when the instructions have completed execution if there are no other instructions 206 writing to the register 204. In this manner, currently executing instructions are tested in the simulation environment.

Figure 3:
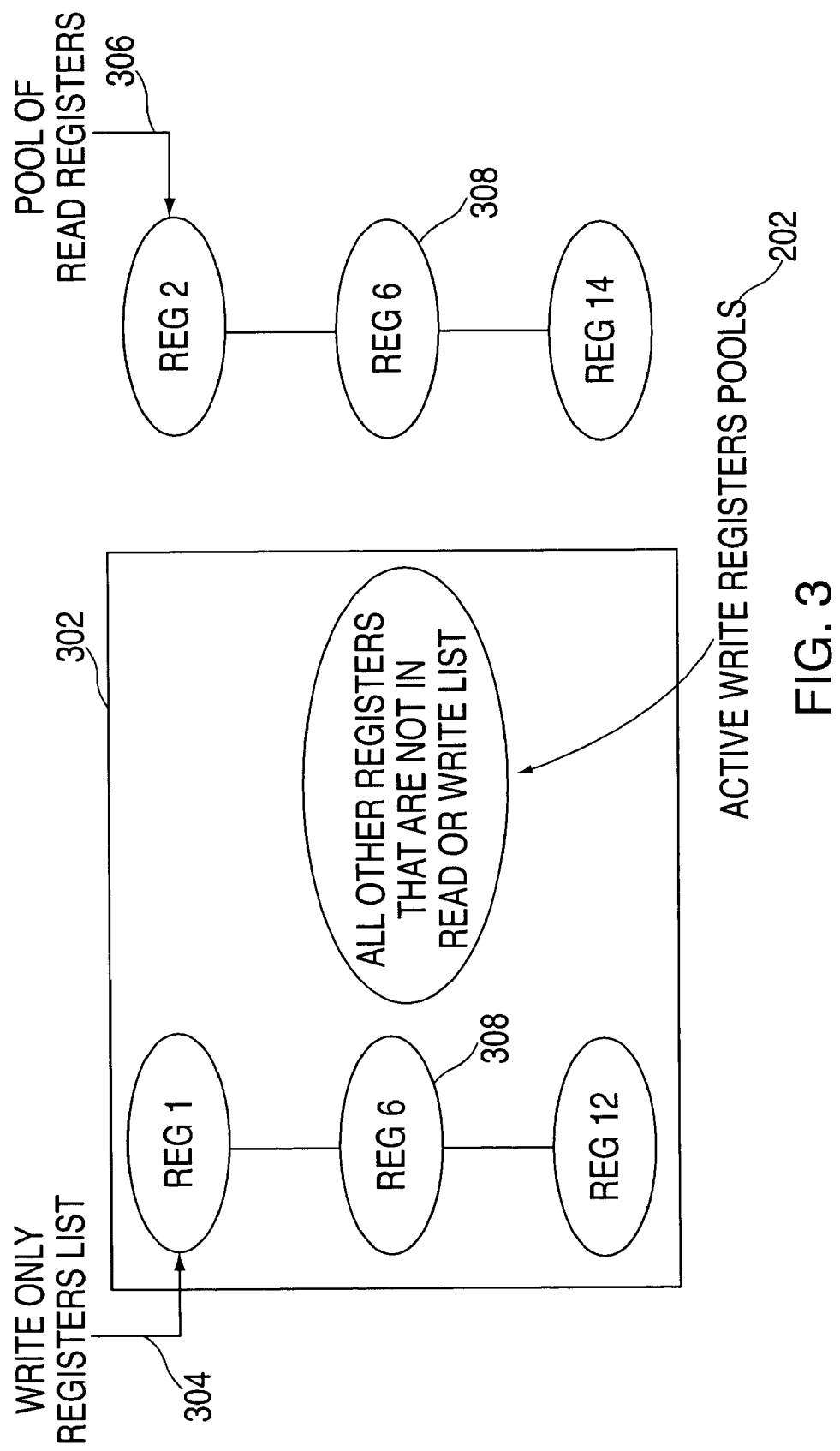
FIG. 3 is a block diagram of register pools during simulation in a non-architecture mode in accordance with exemplary embodiments of the present invention.

FIG. 3 is a block diagram of register pools 302 during simulation in a non-architecture mode in accordance with exemplary embodiments of the present invention. It includes three pools of registers: the write register pool 304, the read register pool 306 and the active write register pool 202. Registers that are not in either the read register pool 306 or the write register pool 304 may be put into the active write register pool 202 for update. Registers in the active write register pool 202 may be randomly selected for update by the register manager 106 in response to a request by the execution unit driver 100. Registers 308 that are in both the read register pool 306 and the write register pool 304 are checked for sequence number. If the instruction containing the register 308 in the write register pool 304 is to be executed earlier than the instruction containing the register 308 in the read register pool 306, the register 308 is put into the active write pool 202 for selection by the execution unit driver 100. If the write of the register comes ahead of the read, the register can be updated right away. The execution unit driver 100 may update the registers by utilizing a variety of patterns including random patterns and sequential patterns. In addition, the execution unit driver 100 may update the registers with data to test particular portions of the processor or memory.

Figure 4:
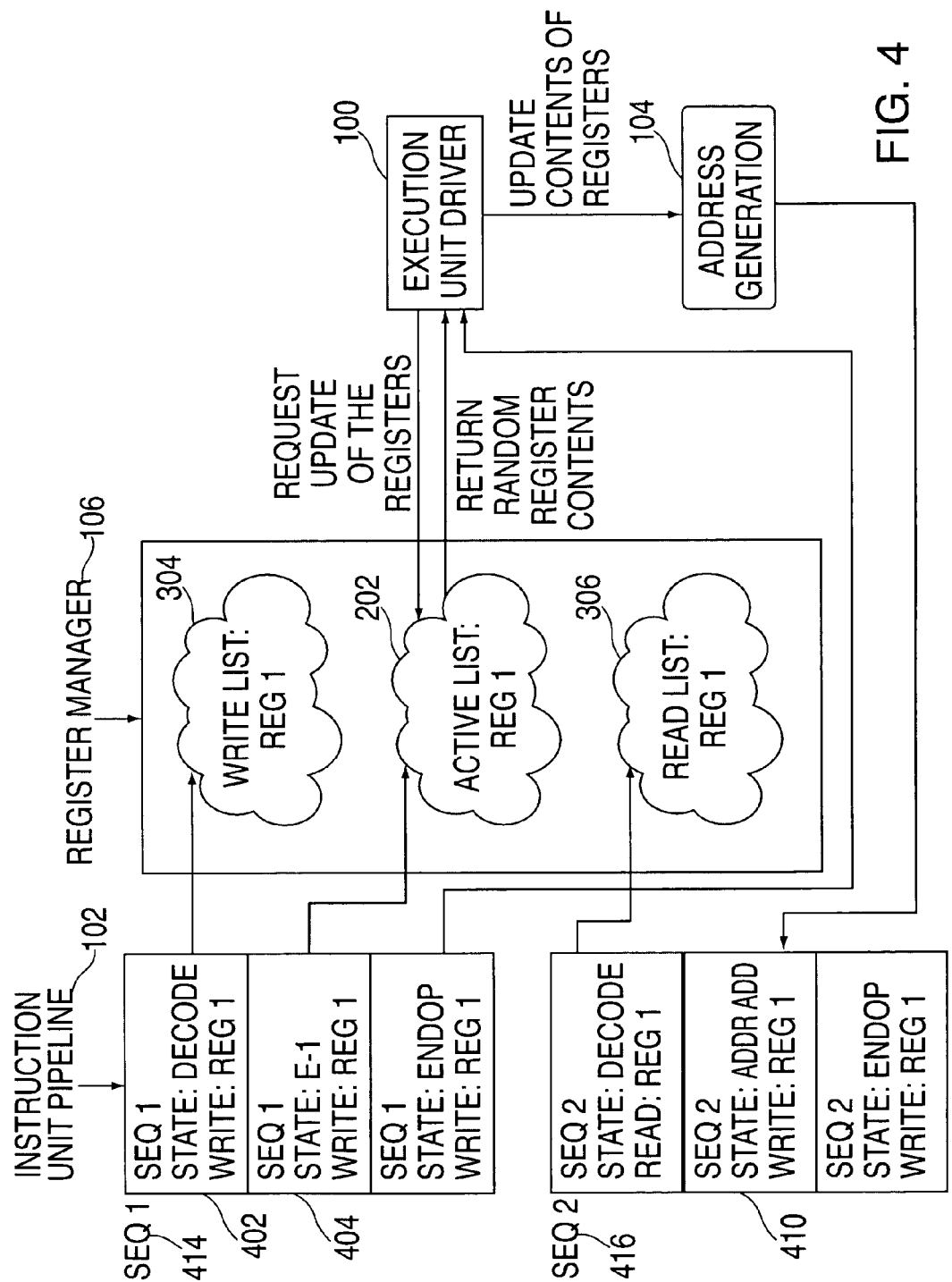
FIG. 4 is a block diagram of a random register update of a standard AGI resolution in the instruction unit decode pipeline in accordance with exemplary embodiments of the present invention.

FIG. 4 is a block diagram of a random register update of an AGI resolution in the instruction unit decode pipeline 102 in accordance with exemplary embodiments of the present invention. Instruction sequence one 414 includes a write to register one and instruction sequence two 416 includes a read from register one. Register one is added to the write register pool 304 with random values as soon as instruction sequence one 414 has been decoded at 402. When instruction sequence one 414 completes the E-1 state 404 (which is past any address add states), register one becomes available in the active write pool 202. Now, if the execution unit driver 100 requests registers for update, register one may be randomly selected from the active write pool 202 by the register manager 106 and if selected, the value contained in register one will be updated by the execution unit driver 100. In addition, instruction sequence two 416 which has been waiting for the availability of register one for its address generation 104 can then proceed to do the address add at 410. When register one is randomly selected by the execution unit driver 100, the value in register one after instruction sequence one 414 has completed will be utilized by the address add at 410.

Figure 5:
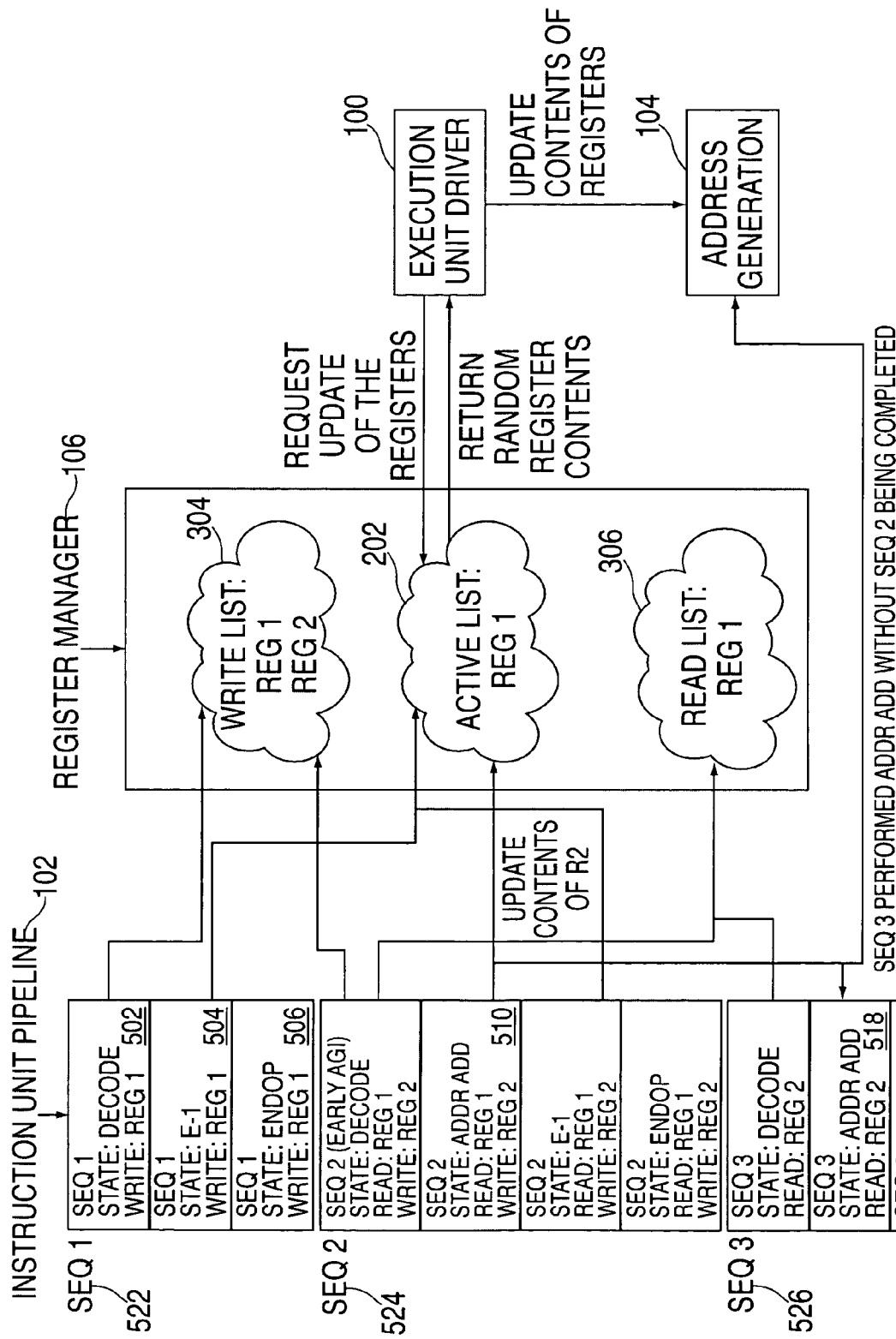
FIG. 5 is a block diagram of a random register update of an early AGI resolution in the instruction unit decode pipeline in accordance with exemplary embodiments of the present invention.

FIG. 5 is a block diagram of a random register update of an early AGI resolution in the instruction unit decode pipeline 102 in accordance with exemplary embodiments of the present invention. There are three instructions in the instruction unit decode pipeline 102. Instruction sequence one 522 includes a write to register one. During its decoding state 502, register one is added to the write pool 304 in the register manager 106. When instruction sequence one 522 reaches an E-1 state 504 (a state past the address add state), register one is moved to the active register write pool 202. The contents of register one can now be selected by the execution unit driver 100 for updating. Instruction sequence two 524 is an AGI early resolution instruction. It reads register one and writes to register two. Register one is added to the read register pool 306 of the register manager 106 and register two is added to the write register pool 304 of the register manager 106. Since it is an AGI instruction, instruction sequence two 524 cannot reach its address add state 510 until the content of register one is resolved (when instruction sequence one 522 has completed execution 506). When instruction sequence two 524 has passed its address add state 510, the contents of register two are updated in the write list 304 for instruction sequence two 524 in the register manager 106. Also, the content of register two is marked available to be used in the address generation 104. At this time, if instruction sequence three 526 only requires register two for its address add 518, it will be moved down in the pipeline for address generation 104. The contents of register two of instruction sequence two 524 will be updated when there is a request from the execution unit driver 100. In this manner sequence three 526 proceeds with its address add without waiting for the completion of sequence two 524.

Figure 6:
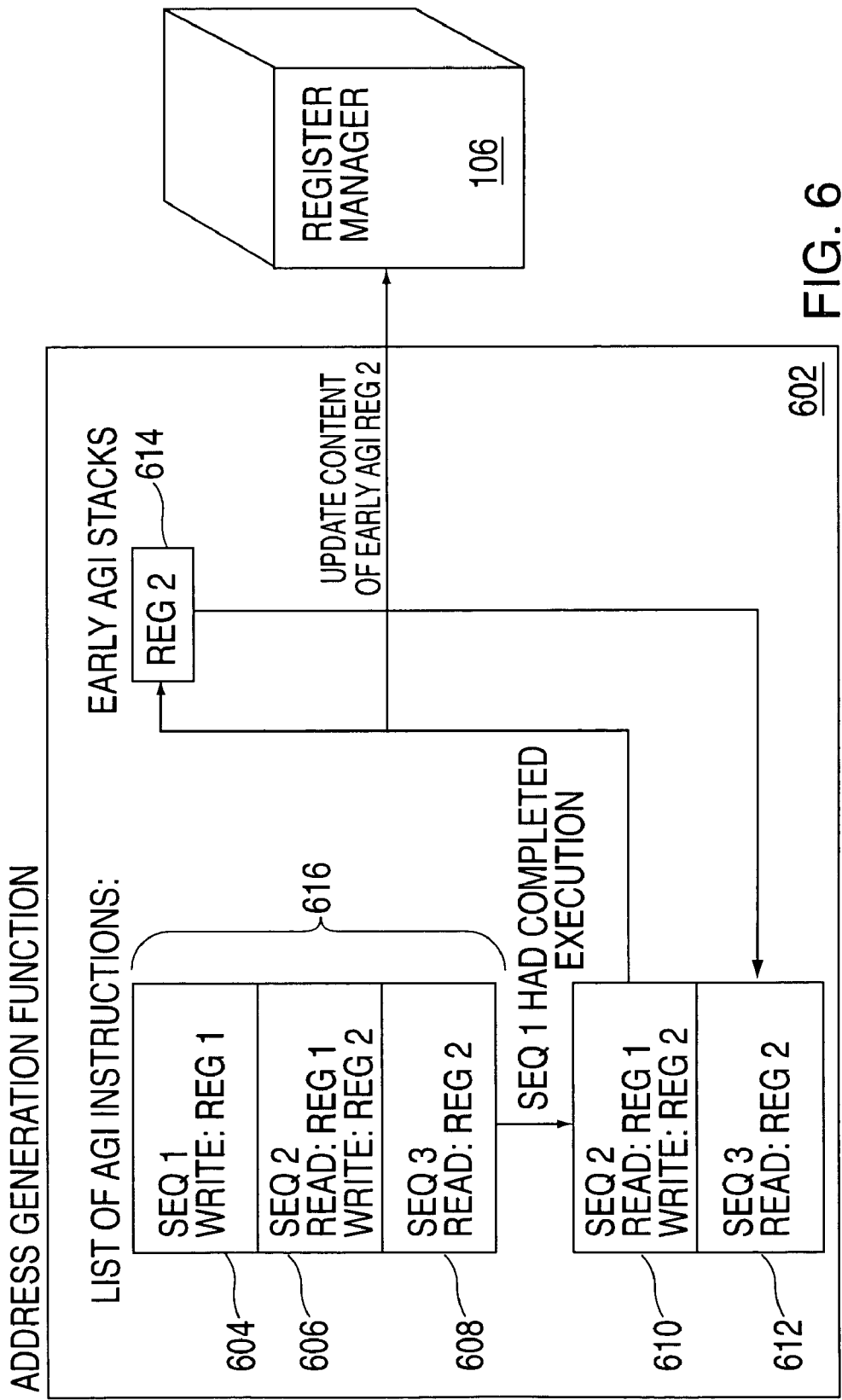
FIG. 6 depicts the relationship between the register manager and the address generation functions for both standard AGI resolution and early AGI resolution in accordance with exemplary embodiments of the present invention.

FIG. 6 depicts the relationship between the register manager 106 and the address generation functions for both AGI resolution and early AGI resolution in accordance with exemplary embodiments of the present invention. Instructions are first checked to determine if they are AGI or AGI early instructions. If they are AGI, they will be grouped in an active AGI instruction pool 616. Instruction pool 616 includes instruction sequences 604, 606, and 608. The instructions that have AGI will be blocked in their address add state 602 until the instruction that holds the interlock register has completed execution and has been removed from the AGI list 616. If the instruction is an AGI early instruction, the contents of its registers are put into the early AGI stack 614 and its contents are sent to the register manager 106. Once active AGI instruction pool 616 is processed, subsequent instruction sequences 610 and 612 are executed.

In addition, there is a special case where the register contents of some instructions take the cache data for their register content. In this case, when the valid signal from the data cache is on, the bus data from the data cache is stored into the early AGI stack 614 and its content is also updated in the register manager 106. In addition, this register can now be put on the active list for updating by the execution unit driver 100.

Exemplary embodiments of the present invention provide a random and sequential register management simulation method to simulate the address interlock function and early resolution of the address interlock function in the instruction pipeline of a processor instruction unit. The simulation system is provided with sufficient data by randomizing the registers to simulate a real world application environment for the processor. In addition, the order execution results of the instruction pipeline are provided by applying the sequential data for the registers to simulate the high performance design of the processor.

The capabilities of the present invention can be implemented in software, firmware, hardware or some combination thereof. As one example, one or more aspects of the present invention may be included in an article of manufacture (e.g., one or more computer program products) having, for instance, computer usable media. The media has embodied therein, for instance, computer readable program code means for providing and facilitating the capabilities of the present invention. The article of manufacture can be included as part of a computer system or sold separately.

The block diagrams presented herein are exemplary. There may be many variations to these diagrams or the steps (or operations) described herein without departing from the spirit of the invention. For instance, the steps may be performed in a differing order, or steps may be added, deleted, or modified. All of these variations are considered a part of the claimed invention.

As described above, the embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. An embodiment of the present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

The invention claimed is:

1. A method for simulating and verifying an address generation interlock (AGI) resolution function and an early AGI resolution function, the method comprising:

receiving an AGI instruction from an instruction unit decode pipeline;

determining if the instruction is an address generation interlock (AGI) type of instruction or an early AGI type of instruction;

if the instruction is an AGI type of instruction, then:
    executing an AGI resolution function in a simulation environment to generate an address for the instruction based on the instruction and a pool of registers, the pool of registers controlled by a register manager using random and sequential register management techniques;

if the instruction is an early AGI type instruction, then:
    executing an early AGI resolution function in a simulation environment to generate an address for the instruction based on the pool of registers and the instruction; and outputting the address to the instruction unit decode pipeline for use in further processing of the instruction;

thereby utilizing the simulation environment to simulate and verify operation of the AGI resolution function and the early AGI resolution function.

2. The method of claim 1 further comprising:

transmitting a request to the register manager to select a register randomly from the registers in the pool;

receiving the contents of the selected register from the register manager; and transmitting a command to the register manager, the command including a new register value and the command directing the register manager to write the new register value into the selected register.

3. The method of claim 2 wherein the pool of registers includes an active write pool and the randomly selected register is from the active write pool.

4. The method of claim 2 wherein the new register value is a random value.

5. The method of claim 2 wherein the new register value is a sequential value.

6. The method of claim 1 wherein:

the instruction includes one or more steps;

the executing an early AGI resolution function includes releasing a register utilized by the instruction to perform an address add step in response to completing the address add step; and the releasing includes allowing the register to be utilized by other instructions.

7. The method of claim 6 wherein the releasing includes adding the register utilized by the instruction to an active write pool within the pool of registers.

8. The method of claim 1 wherein:

the instruction includes one or more steps;

the executing an early AGI resolution function includes reserving a register utilized by the instruction to perform an address add step until the address add step is completed; and the reserving includes preventing the register from being utilized by other instructions.

9. The method of claim 8 wherein the reserving includes the instruction being added to a wait list for the register.

10. The method of claim 8 wherein the reserving includes adding the register utilized by the instruction to at least one of a write pool and a read pool within the pool of registers.

11. The method of claim 1 wherein the executing an AGI resolution function includes releasing a register utilized by the instruction in response to the instruction being completed, wherein the releasing includes, allowing the register to be utilized by other instructions.

12. The method of claim 1 wherein the executing an AGI resolution function includes reserving a register utilized by the instruction until the instruction is completed, wherein the reserving includes preventing the register from being utilized by other instructions.

13. The method of claim 1 wherein the pool of registers includes an active write pool, a write pool and a read pool.

\* \* \* \* \*